United States Patent
Mondt et al.

(10) Patent No.: US 8,274,641 B2
(45) Date of Patent: Sep. 25, 2012

(54) SUBSTRATE TABLE, LITHOGRAPHIC APPARATUS AND DEVICE MANUFACTURING METHOD

(75) Inventors: Eva Mondt, Eindhoven (NL); Noud Jan Gilissen, 's-Gravenzande (NL); Hernes Jacobs, Rossum (NL); Nicolaas Ten Kate, Almkerk (NL); Erik Roelof Loopstra, Eindhoven (NL); Marcus Martinus Petrus Adrianus Vermeulen, Leende (NL); Michel Riepen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 512 days.

(21) Appl. No.: 12/476,089

(22) Filed: Jun. 1, 2009

(65) Prior Publication Data

US 2009/0296056 A1 Dec. 3, 2009

Related U.S. Application Data

(60) Provisional application No. 61/129,047, filed on Jun. 2, 2008.

(51) Int. Cl.
*G03B 27/60* (2006.01)
(52) U.S. Cl. ............................ 355/73; 355/30
(58) Field of Classification Search ..................... 355/30, 355/72, 50, 53, 73, 77
See application file for complete search history.

(56) References Cited

U.S. PATENT DOCUMENTS

| | | | |
|---|---|---|---|
| 4,509,852 A | 4/1985 | Tabarelli | |
| 7,199,858 B2* | 4/2007 | Lof et al. | 355/30 |
| 7,397,532 B2 | 7/2008 | Novak | |
| 7,602,470 B2* | 10/2009 | Kemper et al. | 355/30 |
| 7,936,444 B2 | 5/2011 | Streefkerk et al. | |
| 2004/0136494 A1 | 7/2004 | Lof et al. | |
| 2004/0160582 A1* | 8/2004 | Lof et al. | 355/30 |
| 2004/0207824 A1 | 10/2004 | Lof et al. | |
| 2006/0087630 A1* | 4/2006 | Kemper et al. | 355/30 |
| 2006/0119809 A1 | 6/2006 | Verhagen et al. | |
| 2007/0110213 A1* | 5/2007 | Leenders et al. | 378/34 |
| 2007/0229786 A1 | 10/2007 | Kemper et al. | |
| 2007/0269294 A1* | 11/2007 | Nagasaka et al. | 414/217.1 |
| 2008/0218717 A1 | 9/2008 | Streefkerk et al. | |
| 2009/0091716 A1* | 4/2009 | Kadijk et al. | 355/30 |
| 2009/0296068 A1* | 12/2009 | Castelijns et al. | 355/72 |

FOREIGN PATENT DOCUMENTS

EP 1420300 A2 5/2004

(Continued)

OTHER PUBLICATIONS

Japanese Office Action mailed Jul. 20, 2011 in corresponding Japanese Patent Application No. 2009-126050.

(Continued)

*Primary Examiner* — Thomas R Artman
(74) *Attorney, Agent, or Firm* — Pillsbury Winthrop Shaw Pittman LLP

(57) ABSTRACT

A table is disclosed in which measures are taken to seal between the table and an edge of an object, in use, supported on the table. In particular, a capillary passage is formed between the object on the table and the table itself. A meniscus pinning feature and/or the presence of an overpressure at the radially inward side of the capillary passage holds the liquid in the passage and helps prevent it from advancing further radially inwardly. The features to perform this function may be associated with or formed in a member surrounding the object. The member may be thermally decoupled from a part of the table.

20 Claims, 4 Drawing Sheets

FOREIGN PATENT DOCUMENTS

| | | | |
|---|---|---|---|
| EP | 1429188 A2 | | 6/2004 |
| EP | 1641028 A1 | * | 3/2006 |
| JP | 2004-289127 | | 10/2004 |
| JP | 2004-343114 | | 12/2004 |
| JP | 2006-173527 | | 6/2006 |
| KR | 2007-97362 | | 10/2007 |
| WO | 99/49504 A1 | | 9/1999 |
| WO | 2004/093160 | | 10/2004 |
| WO | 2005/064405 A2 | | 7/2005 |
| WO | WO 2007/083592 A1 | * | 7/2007 |

OTHER PUBLICATIONS

Korean Office Action mailed Feb. 17, 2011 in corresponding Korean Patent Application No. 10-2009-0046946.

* cited by examiner

SUBSTRATE TABLE, LITHOGRAPHIC APPARATUS AND DEVICE MANUFACTURING METHOD

This application claims priority and benefit under 35 U.S.C. §119(e) to U.S. Provisional Patent Application No. 61/129,047, entitled "Substrate Table, Lithographic Apparatus and Device Manufacturing Method", filed on Jun. 2, 2008. The content of that application is incorporated herein in its entirety by reference.

FIELD

The present invention relates to a substrate table, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic e.g. Decalin, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, preferably along the direction of movement of the substrate relative to the final element, and is removed by at least one outlet after having passed under the projection system. That is, as the substrate is scanned beneath the element in a –X direction, liquid is supplied at the +X side of the element and taken up at the –X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets on either side of the projection system PL and is removed by a plurality of discrete outlets arranged radially outwardly of the inlets IN. The inlets and can be arranged in a plate with a hole in its center and through which the projection beam is projected. Liquid is supplied by one groove inlet on one side of the projection system PL and removed by a plurality of discrete outlets on the other side of the projection system PL, causing a flow of a thin film of liquid between the projection system PL and the substrate W. The choice of which combination of inlet and outlets to use can depend on the direction of movement of the substrate W (the other combination of inlet and outlets being inactive).

In European patent application publication no. EP 1420300 and United States patent application publication No. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system substantially the whole top surface of the substrate is covered in liquid. This may be advantageous because then the substantially whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809 in which a member is provided which covers the substrate W in all positions and which is arranged to have immersion liquid extending between it and the top surface of the substrate and/or substrate table which holds the substrate.

SUMMARY

One of the difficulties in immersion lithography is sealing around an edge of the substrate. If liquid leaks under the substrate the leaking liquid can interfere with the substrate support, which, in use, supports the substrate. Furthermore, gas can be trapped in the area between the edge of the substrate and the substrate support. During imaging of the substrate this gas may escape into the immersion liquid. The resulting gas bubbles in the immersion liquid can seriously affect the imaging quality if they move to the image field. Several embodiments of dealing with this issue have been disclosed in European patent application publication no. EP 1,429,188. Those embodiments may not be optimized for use in an all-wet arrangement (described above) and furthermore those embodiments which use a gas in dealing with the edge issues may lead to evaporation losses due to the fact that the gas flow is used to remove liquid.

It is desirable, for example, to provide a table in which one or more of the above-mentioned difficulties in dealing with the interface between an edge of an object and its support are at least partially alleviated, and/or one or more other problems, whether described herein or not, are addressed.

According to an aspect of the invention, there is provided a table for an immersion lithographic apparatus, the table comprising:

a capillary passage forming a surface configured to form a first side of a capillary passage when an object is on the table, a surface of the object forming a second side, opposite the first side, of the capillary passage; and a meniscus pinning feature positioned radially inwardly of the capillary passage forming surface, the meniscus pinning feature configured to pin, in use, a radially inward position of a meniscus of fluid in the capillary passage.

According to an aspect of the invention, there is provided a table for an immersion lithographic apparatus, the table comprising:

a capillary passage forming surface configured to form a first side of a capillary passage when an object is on the table, a surface of the object forming a second side, opposite to the first side, of the capillary passage; and a channel configured such that an overpressure of gas in the channel is effective, in use, to apply a radially outward force on fluid in the capillary passage.

According to an aspect of the invention, there is provided a table for an immersion lithographic apparatus, the table comprising an object support configured to support an object; and a member surrounding the object support and thermally decoupled from a part of the table, the member having a fluid handling feature.

According to an aspect of the invention, there is provided a table for an immersion lithographic apparatus, the table comprising:

a capillary passage forming surface configured to form a first side of a capillary passage when an object is in a recess in a top surface of the table, a surface of the object forming a second side, opposite the first side, of the capillary passage; and an opening in or adjacent to the capillary passage forming surface configured to supply fluid to the capillary passage.

According to an aspect of the invention, there is provided a device manufacturing method comprising:

positioning an object on a table to form a capillary passage between the object and a capillary passage forming surface of the table; and introducing liquid into the capillary passage up to a position at which a radially inward meniscus of the liquid in the capillary passage is pinned in a position by a meniscus pinning feature of the table.

According to an aspect of the invention, there is provided a device manufacturing method comprising:

positioning an object on a table to form a capillary passage between the object and a capillary passage forming surface of the table; and introducing an overpressure of gas in a channel radially inwardly of the capillary passage forming surface to apply a radial outward force on liquid in the capillary passage.

According to an aspect of the invention, there is provided a device manufacturing method comprising:

providing an object on a table so that a member of the table surrounds the object, wherein the member is thermally decoupled from a part of the table and has a fluid handling feature to handle fluid at an edge of the object.

According to an aspect of the invention, there is provided a device manufacturing method comprising:

positioning an object on a table to form a capillary passage between the object and a capillary passage forming surface of the table; and introducing liquid into the capillary passage through an opening in or adjacent to the capillary passage forming surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
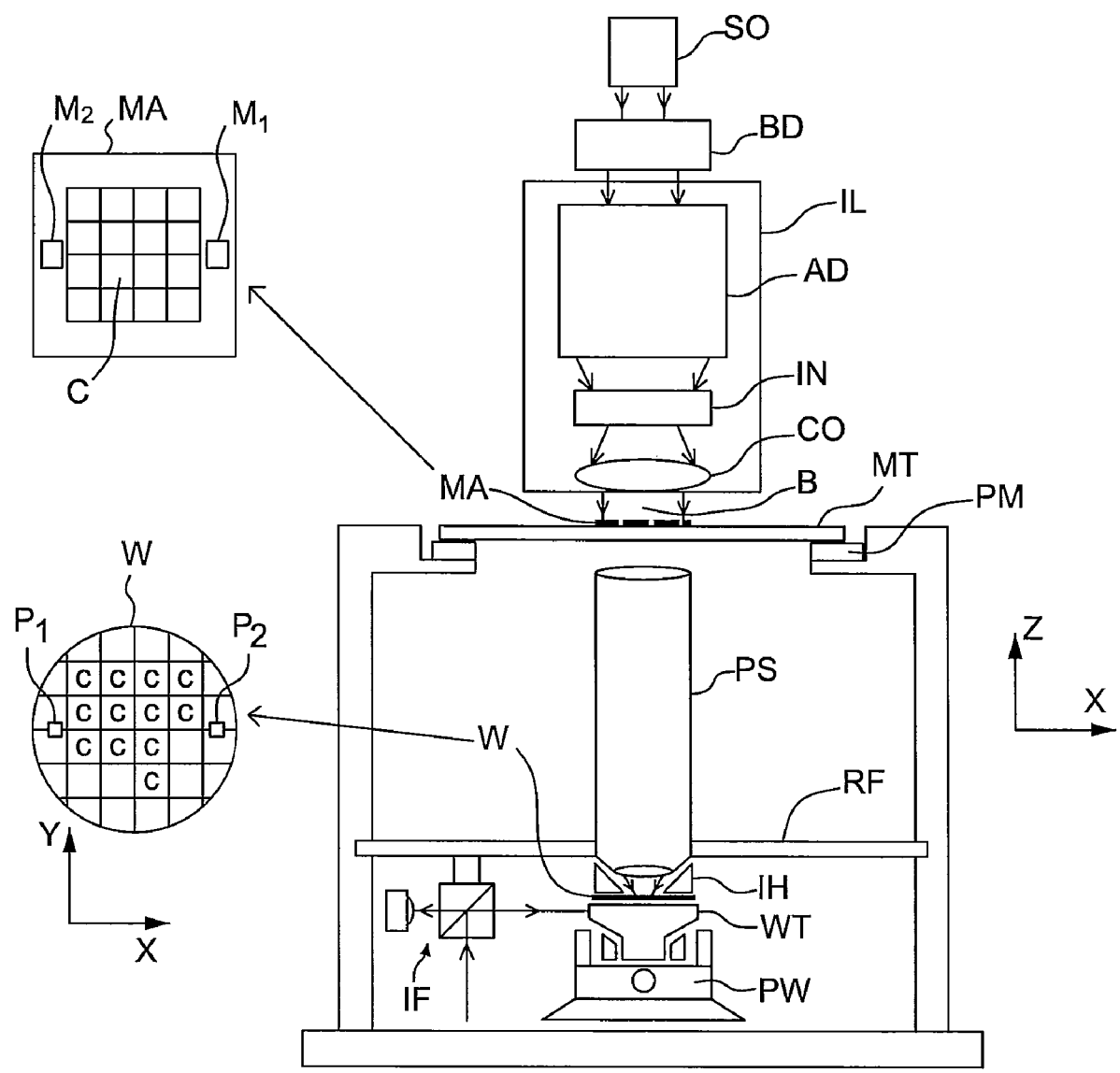
FIG. 1 depicts a lithographic apparatus according to an embodiment of the invention.
Figure 2:
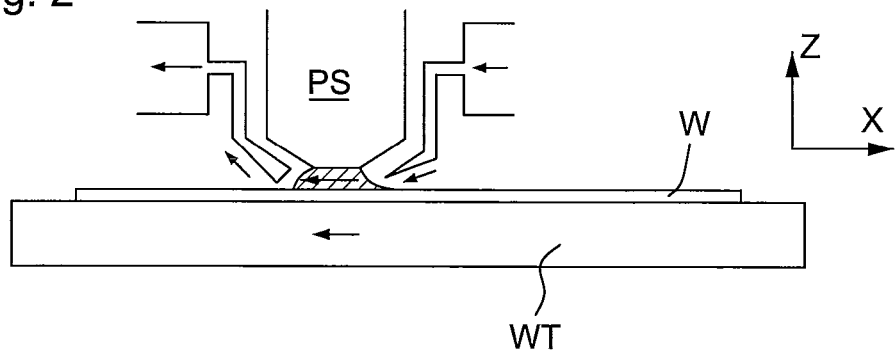
FIGS. 2 and 3 depict a liquid supply system for use in a lithographic projection apparatus.
Figure 3:
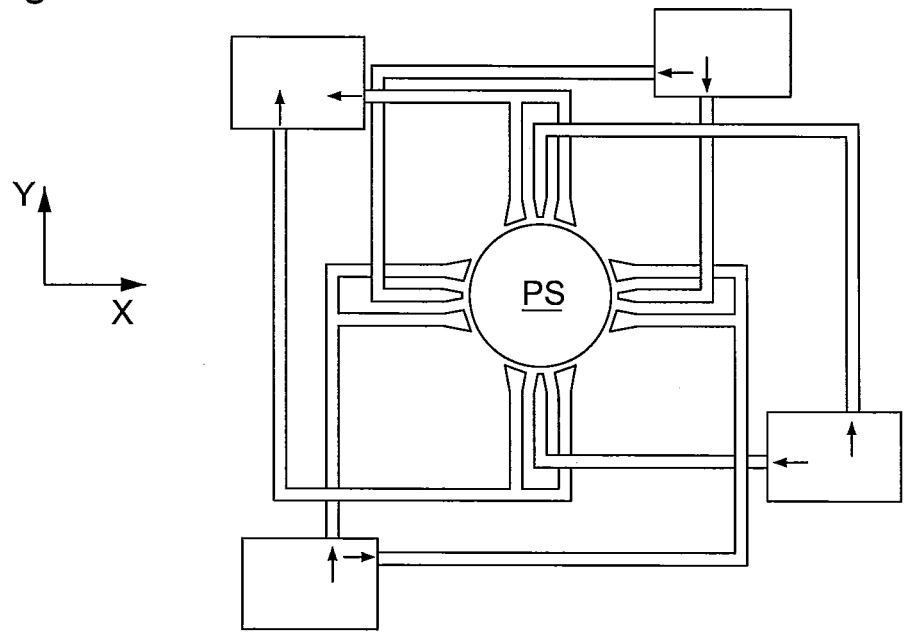
Figure 4:
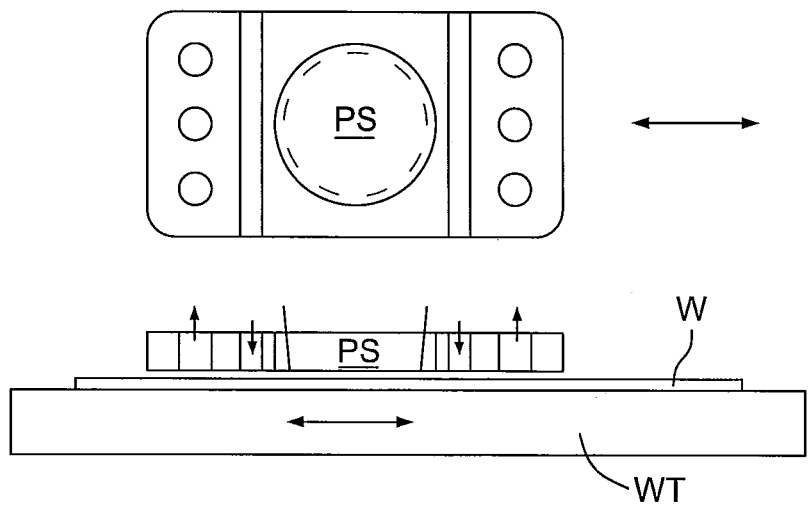
FIG. 4 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and (σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA which is held on the support structure (e.g., mask table) MT and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system PS whilst the substrate W moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
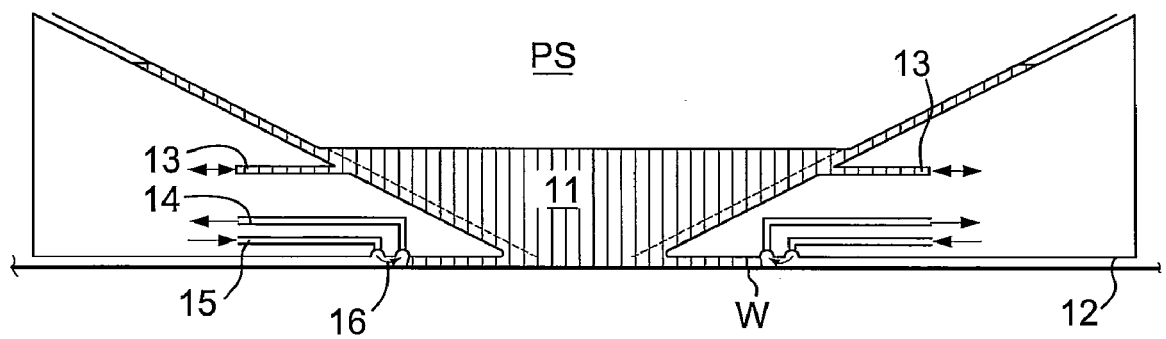
FIG. 5 depicts a further liquid supply system for use in a lithographic projection apparatus.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication No. US 2004-0207824.

FIG. 5 schematically depicts a localized liquid supply system or liquid handling structure with a barrier member 12, IH. The barrier member 12, IH extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The barrier member 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the barrier member 12 positioned below and surrounding the final element of the projection system PL. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

Many other types of liquid supply system are possible. The present invention is not limited to any particular type of liquid supply system. An embodiment of the present invention is optimized for use with an all-wet system in which the liquid between the final element of the projection system and the substrate is unconfined. However, an embodiment of the invention can be used with any other type of liquid supply system.

An embodiment of the present invention is directed at measures taken to handle an edge of a substrate W on a substrate table WT.

In order to account for variations in substrate W dimensions, a substrate table WT is provided with a recess 100 in which a substrate W sits. This is illustrated, for example, in FIG. 6. The recess 100 is radially slightly larger than the size of a substrate W. Thereby a substrate W can be placed in the recess 100 without the need to carefully align the substrate W with the recess 100 (because the recess is larger than the substrate). Also, substrates W of varying size will fit into the same recess 100.

The presence of a gap between the edge of the substrate W and the edge of the recess 100 results in a risk of gas being trapped in that gap and finding its way into the immersion liquid. This is particularly the case when the barrier member 12, IH passes over the gap and the immersion liquid contacts the gap. If bubbles of such gas in immersion liquid find their way underneath the projection system PS, this can lead to imaging defects, which is undesirable.

Another difficulty with the gap between the edge of the substrate W and the edge of the recess 100 is that liquid can find its way under the substrate W. This liquid can interfere with the substrate support which holds the substrate W in place on the substrate table WT. This is undesirable.

One way in which it has been proposed to deal with one or more of the above-mentioned problems is to remove any liquid which finds its way into the gap between the edge of the substrate W and the edge of the recess 100. This may be done using a radially outward and downward flow of gas in the substrate table WT under the substrate W edge. Droplets of liquid are entrained in the gas and removed through the substrate table WT.

An embodiment of the present invention takes measures to fill the gap between the edge of the substrate W and the edge of the recess 100 in the substrate table WT without allowing liquid to penetrate further under the substrate W than a certain amount. Thus a liquid seal is formed. The liquid seal can resist static and dynamic loads, can be filled and emptied.

Figure 6:
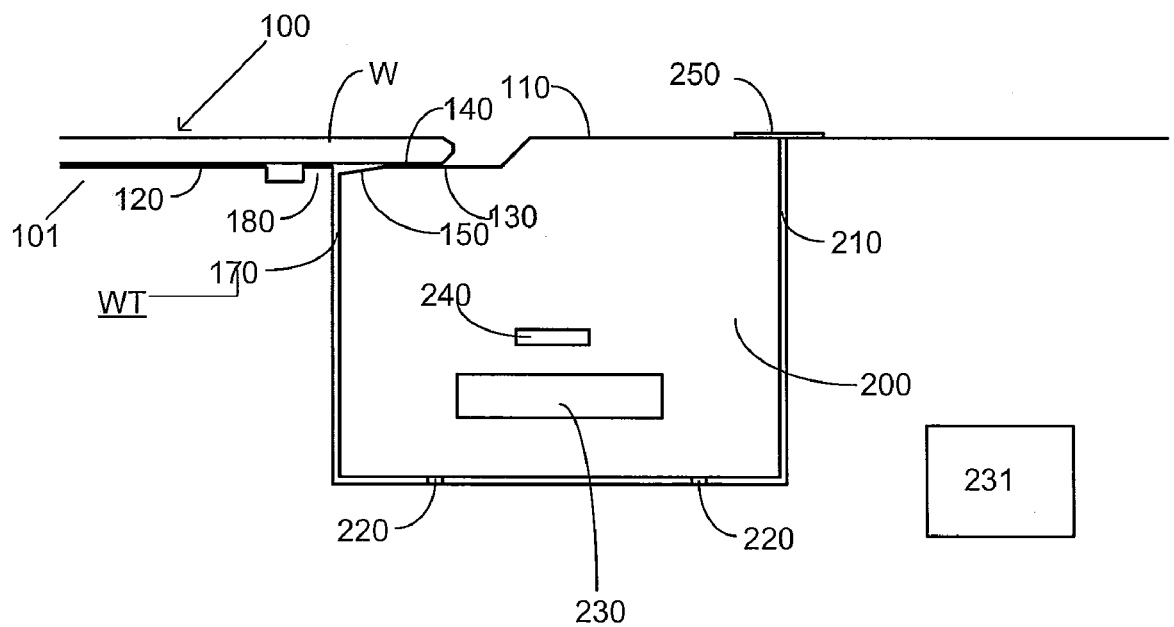
FIG. 6 is a schematic illustration, in cross-section, of a substrate table in the region of the edge of a substrate.

An embodiment is illustrated in FIG. 6. FIG. 6 illustrates, in cross-section, a part of the substrate table WT surrounding an edge of a substrate W. The substrate W is positioned in the recess 100 in a top surface 110 of a substrate table WT. The recess 100 is sized such that the top surface 110 of the substrate table WT outward of the substrate W is substantially coplanar with a top surface of the substrate W.

As illustrated in FIG. 6, the substrate W is supported by a substrate support 101 which comprises a plurality of projections 120. An inlet connected to an underpressure source (not illustrated) is arranged to generate an underpressure in a gap between the projections 120 so that the substrate W is sucked onto the projections 120. This type of substrate support 101 is commonly referred to as a pimple table.

At or near the outer edge of the recess 100, a fluid handling feature in the form of a capillary passage forming surface 130 is formed on the substrate table WT. The capillary passage forming surface 130 is sized and positioned such that, when the substrate W is placed on the substrate support 101, a gap is present between the underside of the substrate W and the capillary passage forming surface 130. Thereby a capillary passage 140 is formed between the substrate W and the capillary passage forming surface 130. The capillary passage forming surface 130 forms a first side 141 of the capillary passage 140. The undersurface of the substrate W forms a second side 142, opposite the first side 141, of the capillary passage 140.

The length of the capillary passage forming surface 130 in a direction away from the central axis of the substrate W is such that when a substrate W within tolerance both in terms of size and in terms of placement, is positioned on the substrate support 101, a capillary passage 140 will be formed of a suitable length (as discussed below).

The capillary passage forming surface 130 is substantially coplanar with the bottom surface of the substrate W (and therefore substantially parallel to the top surface of the substrate W and the top surface 110 of the substrate table WT).

Radially inwardly of the capillary passage forming surface 130 is a further fluid handling feature, this time in the form of a meniscus pinning feature 150. The meniscus pinning feature 150 can take any form. The function of the meniscus pinning feature 150 is to pin the meniscus 160 (see FIG. 7) of liquid in the capillary passage 140 at a certain location or within a range of certain locations (i.e. at a certain radial distance away from the edge of the recess 100, for example). The meniscus pinning feature 150 is designed to pin a meniscus 160 extending between the meniscus pinning feature 150 and the substrate W. Therefore the capillary passage 140 can be seen to extend beyond the capillary passage forming surface 130 and above the meniscus pinning feature 150 also. The shape and/or position of the meniscus at the meniscus pinning feature 150 varies as different forces are placed on the liquid. The change in shape and/or position of the meniscus enables absorption of pressure fluctuations (e.g. due to scan movements) in the liquid.

In the embodiment of FIG. 6 the meniscus pinning feature 150 is a surface in the form of a truncated cone. That is, in plan, it makes an angle to the plane of the capillary passage forming surface 130, i.e. it is inclined. The radially innermost edge of the meniscus pinning feature 150 is further away from the plane of the capillary passage forming surface 130 than the radially outward edge of the capillary passage forming surface 130. The meniscus can move along the surface of the truncated cone to absorb pressure fluctuations (radially inwards on one side and radially outwards on the other).

The meniscus pinning feature 150 works in the following way: As the meniscus of liquid 160 in the capillary passage 140 moves radially inwardly (i.e., towards a central part of the substrate W), the length of the meniscus 160 spanning between the substrate W and the substrate table WT (the capillary passage forming surface 130 or the meniscus pinning feature 150) increases. As the length of the meniscus 160 increases, its energy decreases.

In cross-section, the meniscus pinning feature 150 of the embodiment of FIG. 6 makes an angle of between 0 and 45° or between 10 and 45° (desirably between 20 and 35°) with the plane of the capillary passage forming surface 130. In an embodiment, the transition between the horizontal surface and the inclined surface of the meniscus pinning feature 150 is smooth. That is, a radius between the two surfaces is as large as possible.

Figure 7:
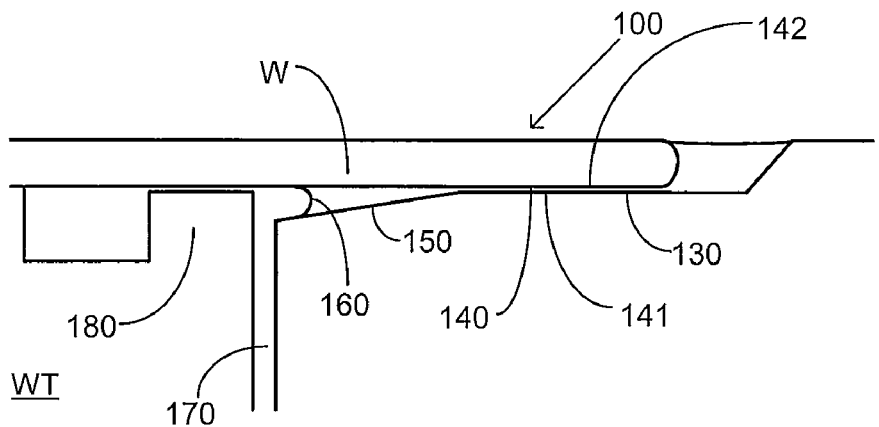
FIG. 7 is a magnified view of the area of the edge of the substrate illustrated in FIG. 6.

FIG. 7 shows the position of a meniscus 160 in more detail. In the FIG. 6 embodiment the capillary passage 140 has been filled with liquid. The liquid has extended radially inwardly to cover parts of the meniscus pinning feature 150. However, the meniscus pinning feature 150 has pinned the meniscus 160 at a position between the radially innermost and radially outermost parts of the meniscus pinning feature 150. Thereby the passage of liquid radially inwardly past the innermost edge of the meniscus pinning feature 150 has been prevented.

The position of the meniscus 160 is determined by a balance of forces. Liquid fills the gap in the recess 100 between the edge of the substrate W and the edge of the recess 100. A radially inwardly capillary force is generated on the liquid in the capillary passage 140. On top of this force are hydrostatic and hydrodynamic forces which act mainly radially inwardly. The meniscus pinning feature 150 resists the radially inward forces. The force on the liquid in the capillary passage 140 in a radially outward direction can be increased by providing a channel 170 radially inwardly of the meniscus pinning feature 150. The channel 170 is in fluid communication with the capillary passage 140. An overpressure of gas can be provided in the channel 170. The force of this gas on the meniscus 160 is effective to apply a radially outward force on the liquid in the capillary passage 140. This can help in preventing liquid from moving radially inwardly of the radially inwardmost part of the meniscus pinning feature 150. Therefore the pressure in channel 170 can be seen as positioning the meniscus 160.

The positioning of the channel 170 radially inwardly of the meniscus pinning feature 150 (in an embodiment directly inwardly of the meniscus pinning feature 150) helps ensure that the channel 170 is configured so that any flow of gas out of the channel 170 will be in a substantially radially inward direction. In this way the entrainment of liquid from the capillary passage 140 into the gas can be substantially prevented. Thereby evaporation cooling loads as a result of the flow of gas and liquid can be substantially avoided.

Radially inwardly of the channel 170 is an inner projection 180. In one embodiment the inner projection 180 is sized such that its top surface is substantially coplanar with the plane of the capillary passage forming surface 130. Therefore when the substrate W is placed on the substrate support 101, a gap exists between the top of the inner projection 180 and the bottom of the substrate W. The gap is similar in size to the gap between the capillary passage forming surface 130 and the bottom surface of the substrate W (i.e. the height of the capillary passage 140). In an embodiment, the gap between the inner projection 180 and the bottom surface of the substrate W and the height of the capillary passage 140 is selected from the range of 1-50 μm or 1-20 μm or 2-20 μm or 1-10 μm or 1-5 μm. A small capillary passage 140 height is desirable for the resistance of dynamic forces induced by acceleration. There is an optimum height for the capillary passage 140, depending on operating conditions and contact angles of the immersion liquid with the capillary passage forming surface 130 and the underside surface of the substrate W.

The gap between the inner projection 180 and the bottom of the substrate W is chosen such that the flow of gas radially inwardly is limited, thereby to reduce any possible heat load which may be present due to evaporation. If the underpressure used by the substrate support 101 is taken to be at 0.5 bar, a suitable overpressure in the channel 170 is about 10 mbar. If the gap between the top of the inner projection 180 and the bottom of the substrate W is about 3 μm, then a gas flow of 0.7 l/min through the gap between the inner projection 180 and the substrate W can be expected. This may provide satisfactory operating conditions, but lower pressures in the channel 170 can also be used. In use, after exposure of the substrate, the overpressure applied to the channel 170 may be reduced. This avoids thermal loads due to evaporation of the liquid left behind on the member 200 when the substrate W is removed.

It is desirable to have a large operating window available in which the position of the meniscus 160 can be pinned by the meniscus pinning feature 150. One way of varying the operating parameters is to change the affinity of the surfaces of the capillary passage forming surface 130 and/or of the meniscus pinning feature 150 to the immersion liquid (i.e. by making one or more of the surfaces liquidphobic or liquidphillic to the immersion liquid). By making one or more of those surfaces more liquidphillic, better wetting can be achieved which in turn reduces the chances of bubbles of gas emanating from the gap between the edge of the substrate W and the edge of the recess 100 during use.

Various different surfaces exhibit differences between a static contact angle, a static advancing contact angle and a static receding contact angle with immersion liquid. A static advancing contact angle of between 40 and 70° may be desirable. This helps with filling of the capillary passage 140 and thereby expelling gas from the capillary passage 140 and the gap between the edge of the substrate W and the edge of the recess 100. In order to encourage wetting, it is desirable that the static receding contact angle is less than 40°, less than 30°, less than 20°, or less than 15°. The static receding contact angle is usually less than the static advancing contact angle. It is desirable that the surface defining the channel 170 and the surface defining the projection 180 are of a material with which the immersion liquid has a high contact angle. That is, those surfaces are liquidphobic.

An explanation of how the gap and capillary passage 140 may be filled with immersion liquid in an embodiment is described below. The embodiment described with reference to FIG. 9 has further features to ensure good filling of the capillary passage 140. Otherwise in the other embodiments the gap and capillary passage 140 may be allowed to be filled with immersion liquid during normal operation or other measures could be taken to fill the gap and capillary passage 140 prior to imaging.

As can be seen in FIG. 6 some of the fluid handling features (for example the capillary passage forming surface 130 and the meniscus pinning feature 150) are formed on a member 200 which is separate from other parts of the substrate table. The member 200 is configured to deal, in use, with issues of liquid interaction with an edge of the substrate W which is supported on the substrate support 101. A gas gap 210 is present between the outer surface of the member 200 and the remainder of the substrate table WT. The gap 210 acts as an insulator so that the member 200 is thermally decoupled from other parts of the substrate table WT. In an embodiment the gap 210 may be filled with an insulating material other than gas. The member 200 is mechanically coupled to the substrate table WT via discrete mounting members 220. These discrete mounting members 220 are desirably made of low thermal conductivity coefficient material. The mounting members 220 may be leaf springs, spring blades or may be glass beads which are glued to the substrate table WT and the member 200, for example.

The channel 170 is formed by an edge of the member 200 and an edge of the substrate table WT. However, other arrangements are possible.

The purpose of the member 200, which is thermally decoupled from other parts of the substrate table WT, is to avoid upsetting the thermal equilibrium of the substrate table WT. The fluid handling features of the member 200 are features which can induce a heat load. Therefore by thermally decoupling those features from the remainder of the substrate table WT, any potential unwanted thermal expansion or contraction can be isolated.

In an embodiment, one or more heaters 230 which are illustrated schematically in FIG. 6 can be provided in or on the member 200. The heater(s) can be accompanied by one or more sensors 240 to sense the temperature of the member 200 and a controller 231 can control power to the heater(s) 230 (in a feedback manner, for example, based on the temperature sensed by the sensor(s) 240).

The member 200 surrounds the substrate support 101. It forms the capillary passage forming surface 130 and the meniscus pinning feature 150 as well as a part of the top surface 110 of the substrate table WT. The gap 210 between the member 200 and the substrate table WT is covered by a sticker 250. The sticker 250 is made of a thin material and is glued in place to prevent immersion liquid from finding its way in the gap 210 between the member 200 and the substrate table WT. Other ways of sealing that gap may also be available. The sticker 250, in the embodiment of FIG. 6, is annular.

The member 200 also provides an edge seal member. The edge seal member at least partly surrounds the edge of the substrate W. The top surface of the edge seal member is substantially coplanar with the top surface of the substrate W. In the illustrated embodiment, the edge seal member is the top surface and inner upper edge of the member 200.

Figure 8:
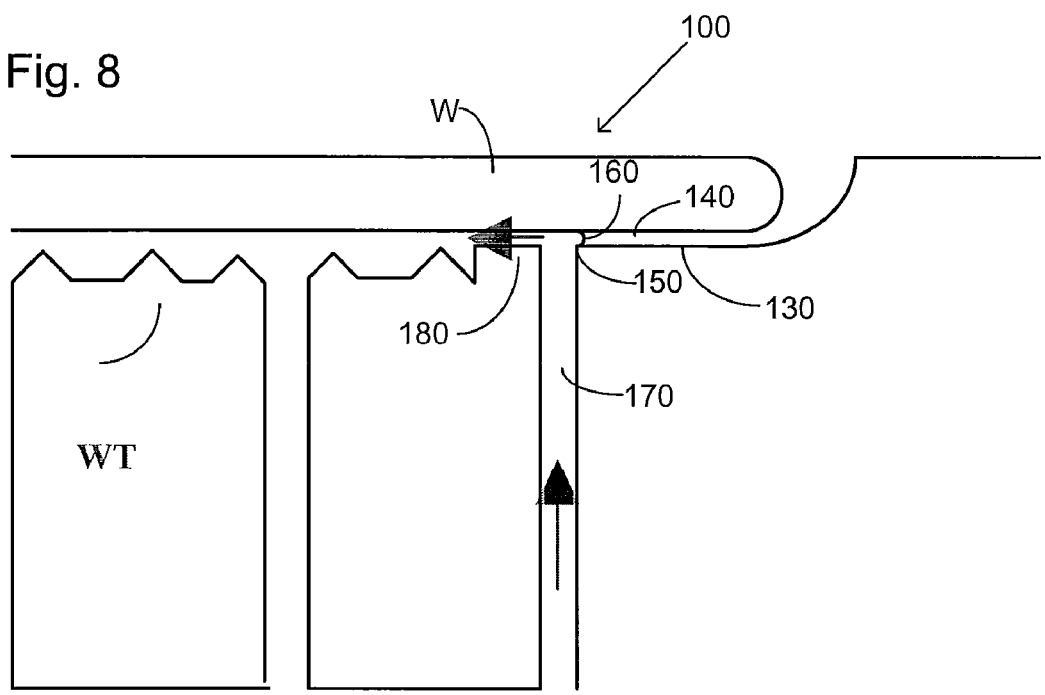
FIG. 8 illustrates schematically, in cross-section, the area around an edge of a substrate of a substrate table of a further embodiment.

FIG. 8 illustrates the passage of gas from the channel 170, above the inner projection 180, towards the substrate support 101. This embodiment differs from that of FIGS. 6 and 7 in that the meniscus pinning feature 150 is a sharp corner. A corner with a radius of 1 μm may result in the meniscus 160 not being pinned well enough. However, for a radius of 3 μm the position of the meniscus 160 at the meniscus pinning feature 150 may be stable. Therefore, if the meniscus pinning feature 150 is a sharp corner, it is desirable that the corner has a radius of greater than 2 μm, greater than 5 μm, or greater than 10 μm. The corner could have a radius of less than 10 μm. If the surfaces after the corner are made liquidphobic, this also helps pin the meniscus at the corner. Conversely, a sharp edge on the radially outermost edge of the inner projection 180 is desirable. This increases flow resistance.

The length of the capillary passage 140 may have little bearing upon the pressure at which the meniscus 160 is no longer pinned. However, the length (i.e., extending relative to a central portion of the substrate or other object such as radial length) of the capillary passage forming surface 130 should be enough to accommodate the likely variation in substrate W size and placement. This is illustrated with reference to FIG. 9. In an embodiment, the capillary passage 140 is at least 1 mm, at least 3 mm, at least 5 mm or at least 10 mm long.

It is desirable to avoid the edge of the substrate overhanging over the last projections 120 of the substrate support 101 with which it has contact by too much. If the edge of the substrate overhangs by too much this can lead to bending of the substrate and the introduction of imaging errors.

In an embodiment, the channel 170 is connected to an overpressure source via a plurality of openings (not illustrated). Each opening could have a cross-sectional area of 0.2 mm², for example. By providing the connection between the overpressure source and the channel 170 by a plurality of openings, pressure fluctuations can be reduced.

As is illustrated in FIG. 8, the edge of the recess 100 is curved in the embodiment. The curvature is chosen such that wetting and dewetting of the gap between the edge of the substrate W and the edge of the recess 100 (and filling of the capillary passage 140) is encouraged.

Figure 9:
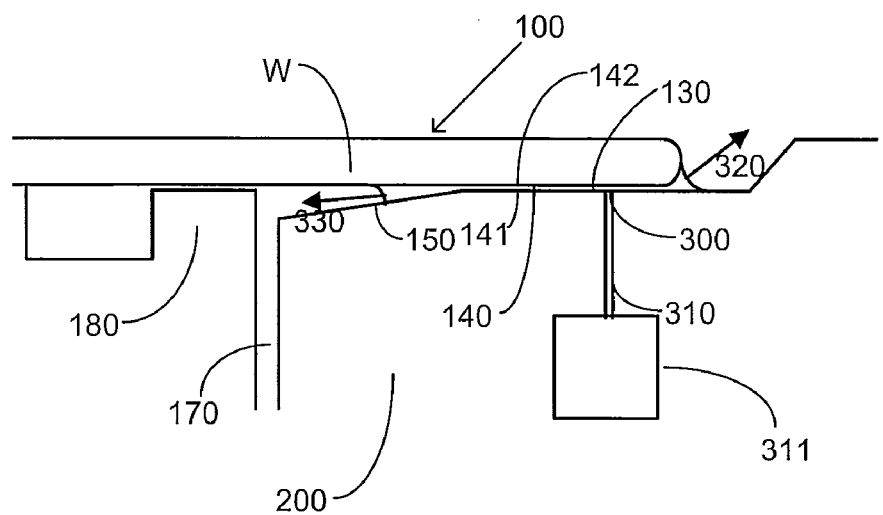
FIG. 9 illustrates schematically, in cross-section, the area of a substrate table adjacent the edge of a substrate of a further embodiment.

The embodiment of FIG. 9 illustrates one way of aiding wetting of the gap between the edge of the substrate W and the edge of the recess 100 and the capillary passage 140. In that embodiment it is not necessary for the surfaces from the edge of the recess 100 to the innermost edge of the capillary passage 140 to be specifically treated to increase the affinity of liquid for the surface. For example, those surfaces can be made of the same material and treated in the same way as the surfaces of the top of the substrate table.

The embodiment of FIG. 9 is the same as the embodiment of FIGS. 6 and 7 except as described below. In the FIG. 9 embodiment an opening 300 is provided in the capillary passage forming surface 130 or adjacent the capillary passage forming surface 130. The opening 300 is within the recess 100. The opening 300 may be one or more holes or a slit. The opening 300 may be in the capillary passage forming surface 130 and/or in the surface of the meniscus pinning feature 150.

The opening 300 is connected via a passage 310 to a liquid supply source 311. In this way liquid can be supplied to the gap between the edge of the substrate W and the edge of the recess 100 and into the capillary passage 140. This helps in wetting the capillary passage 140 and driving out gas. For example, it can be seen that by providing liquid to the opening 300 a droplet of liquid will expand. This is illustrated by arrows 320 and 330 to fill the gap between the edge of the substrate W and the edge of the recess 100 as well as to fill the capillary passage 140.

The use of an opening 300 to supply liquid into the gap and capillary passage 140 means that it may not be necessary for the surfaces around the bottom edge of the recess 100 to be specially coated or treated or formed with a material such that they are liquidphillic to the immersion liquid.

The liquid provided through the opening 300 is desirably the same as the immersion liquid used between the final element of the projection system PS and the substrate W. A possible advantage of providing liquid through the opening 300 is that the liquid in the gap can be refreshed. Otherwise, contamination particles may accumulate around the edge of the recess 100. By supplying liquid through the opening 300 a circulation of liquid can be set up in the gap at the edge of the recess 100, thereby flushing out contamination and preventing accumulation of contaminating particles in the edge of the recess 100. The liquid supplied can be part of the liquid used to cover the top surface of the substrate W and substrate table WT in an all wet immersion system.

The opening 300 can, in one embodiment, be connected to an under pressure source. This can help in removing immersion liquid before or after releasing the substrate W from the substrate table WT after exposure.

Although the above embodiments have been described with reference to a substrate support 101 and a substrate W, the invention is not limited to this feature. For example, an embodiment of the invention could be directed to the mounting of a different object on an object support on a substrate table WT. For example, the object could be a sensor which is supported on a sensor support on the top surface of a substrate table WT.

As will be appreciated, any of the above described features can be used with any other feature and it is not only those combinations explicitly described which are covered in this application.

In an aspect, there is provided a table for an immersion lithographic apparatus, the table comprising a capillary passage forming surface configured to form a first side of a capillary passage when an object is on the table, a surface of the object forming a second side, opposite the first side, of the capillary passage, and a meniscus pinning feature positioned radially inwardly of the capillary passage forming surface, the meniscus pinning feature configured to pin, in use, a radially inward position of a meniscus of fluid in the capillary passage. Optionally, the meniscus pinning feature is a sharp edge at the end of the capillary passage forming surface. Desirably, the sharp edge has a radius of at least 2 μm. Optionally, the meniscus pinning feature is a surface radially inwardly of the capillary passage forming surface, the surface of the meniscus pinning feature being inclined, in cross-section, at an angle to the plane of the capillary passage forming surface such that a radially innermost edge of the surface of the meniscus pinning feature is further away from the plane of the capillary passage forming surface than a radially outer part of the surface of the meniscus pinning feature. Desirably, in plan, the surface of the meniscus pinning feature makes an angle of between 0 and 45°, or between 10 and 45°, with the plane of the capillary passage forming surface. Optionally, the table further comprises radially inwardly of the meniscus pinning feature a channel configured such that an overpressure of gas in the channel is effective, in use, to apply a radially outward force on liquid in the capillary passage. Optionally, the capillary passage forming surface has a radial length of at least 1 mm. Optionally, when an object is on the table, the capillary passage has a height of between 1 and 50 µm. Optionally, the table further comprises, radially inwardly of the capillary passage forming surface, an inner projection which surrounds an object support of the table, a distance between an object, in use, on the object support and the inner projection being between 2 and 20 µm. Optionally, the capillary passage forming surface is substantially parallel to a top surface of the table. Optionally, the capillary passage forming surface is liquidphillic.

In an aspect, there is provided a table for an immersion lithographic apparatus, the table comprising a capillary passage forming surface configured to form a first side of a capillary passage when an object is on the table, a surface of the object forming a second side, opposite to the first side, of the capillary passage, and a channel configured such that an overpressure of gas in the channel is effective, in use, to apply a radially outward force on fluid in the capillary passage. Optionally, the table further comprises, radially inwardly of the channel, an inner projection which surrounds an object support of the table, the object support configured to support the object. Desirably, when an object is on the table, the object is between 2 and 20 µm from the inner projection. Desirably, in use, a gas flows out of the channel and between the inner projection and the object. Optionally, the table further comprises an object support having a plurality of projections to support the object and an inlet connected to an underpressure source to create an underpressure in a gap between the plurality of projections to suck the object to the projections. Optionally, in use, a radially inward flow of gas is generated by an overpressure in the channel. Optionally, the table further comprises a meniscus pinning feature positioned between the capillary passage forming surface and the channel, the meniscus pinning feature configured to pin, in use, a radially inward position of a meniscus of fluid in the capillary passage. Optionally, the capillary passage forming surface is formed by a member surrounding an object support of the table, which member is thermally decoupled from a part of the table and the object support is configured to support the object.

In an aspect, there is provided a table for an immersion lithographic apparatus, the table comprising an object support configured to support an object, and a member surrounding the object support and thermally decoupled from a part of the table, the member having a fluid handling feature. Optionally, the fluid handling feature is configured to deal, in use, with issues of liquid interaction with an edge of an object supported by the object support. Optionally, the fluid handling feature comprises a capillary passage forming surface configured to form a first side of a capillary passage when an object is on the object support, a surface of the object forming a second side, opposite the first side, of the capillary passage. Optionally, the fluid handling feature comprises a meniscus pinning feature configured, in use, to pin a radially inward position of a meniscus of fluid. Optionally, the fluid handling feature comprises an opening for the provision of a fluid, in use, into an area adjacent an edge of an object positioned on the object support. Optionally, the table further comprises a channel. Desirably, the channel is formed between the member and a part of the table, radially inwardly of the member. Desirably, the channel is formed in the member. Optionally, the member is thermally decoupled from a part of the table by an insulator between the member and the part of the table. Desirably, the insulator is gas. Optionally, the member is attached to the table by a plurality of individual supports. Optionally, the member is an edge seal member which at least partly surrounds an edge of an object when supported by the object support, a top surface of the member being substantially coplanar with a top surface of the object. Optionally, the table further comprises a heater in the member. Desirably, the table further comprises a controller configured to control the heater to control the temperature of the member.

In an aspect, there is provided a table for an immersion lithographic apparatus, the table comprising a capillary passage forming surface configured to form a first side of a capillary passage when an object is in a recess in a top surface of the table, a surface of the object forming a second side, opposite the first side, of the capillary passage, and an opening in or adjacent to the capillary passage forming surface configured to supply fluid to the capillary passage. Optionally, the table is configured for an immersion lithographic apparatus in which liquid is unconfined on the top surface of a substrate and a top surface of the table. Optionally, the object is a substrate or a sensor.

In an aspect, there is provided a lithographic apparatus comprising a table described above. Optionally, the lithographic apparatus is an immersion lithographic apparatus.

In an aspect, there is provided a device manufacturing method comprising positioning an object on a table to form a capillary passage between the object and a capillary passage forming surface of the table, and introducing liquid into the capillary passage up to a position at which a radially inward meniscus of the liquid in the capillary passage is pinned in a position by a meniscus pinning feature of the table.

In an aspect there is provided a device manufacturing method comprising positioning an object on a table to form a capillary passage between the object and a capillary passage forming surface of the table, and introducing an overpressure of gas in a channel radially inwardly of the capillary passage forming surface to apply a radial outward force on liquid in the capillary passage.

In an aspect, there is provided a device manufacturing method comprising providing an object on a table so that a member of the table surrounds the object, wherein the member is thermally decoupled from a part of the table and has a fluid handling feature to handle fluid at an edge of the object.

In an aspect, there is provided a device manufacturing method comprising positioning an object on a table to form a capillary passage between the object and a capillary passage forming surface of the table, and introducing liquid into the capillary passage through an opening in or adjacent to the capillary passage forming surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A table for an immersion lithographic apparatus, the table comprising:
a capillary passage forming surface configured to form a first side of a capillary passage when an object is on the table, a surface of the object forming a second side, opposite the first side, of the capillary passage; and
a meniscus pinning feature positioned radially inwardly of the capillary passage forming surface, the meniscus pinning feature configured to pin a radially inward position of a meniscus of fluid in the capillary passage when the meniscus pinning feature is contacted by the fluid, wherein liquid flow out of the radially inward end of the capillary passage is prevented.

2. The table of claim 1, wherein the meniscus pinning feature is a sharp edge at the end of the capillary passage forming surface.

3. The table of claim 2, wherein the sharp edge has a radius of at least 2 µm.

4. The table of claim 1, wherein the meniscus pinning feature is a surface radially inwardly of the capillary passage forming surface, the surface of the meniscus pinning feature being inclined, in cross-section, at an angle to the plane of the capillary passage forming surface such that a radially innermost edge of the surface of the meniscus pinning feature is further away from the plane of the capillary passage forming surface than a radially outer part of the surface of the meniscus pinning feature.

5. The table of claim 4, wherein, in plan, the surface of the meniscus pinning feature makes an angle of more than 0 and less than or equal to 45° with the plane of the capillary passage forming surface.

6. The table of claim 1, further comprising radially inwardly of the meniscus pinning feature a channel configured such that an overpressure of gas in the channel is effective to apply a radially outward force on liquid in the capillary passage when liquid is in the capillary passage.

7. The table of claim 1, wherein the capillary passage forming surface has a radial length of at least 1 mm.

8. The table of claim 1, wherein, when an object is on the table, the capillary passage has a height of between 1 and 50 µm.

9. The table of claim 1, further comprising, radially inwardly of the capillary passage forming surface, an inner projection which surrounds an object support of the table, a distance between an object when supported on the object support and the inner projection being between 2 and 20 µm.

10. The table of claim 1, wherein the capillary passage forming surface is substantially parallel to a top surface of the table.

11. The table of claim 1, wherein the capillary passage forming surface is liquidphillic.

12. The table of claim 1, wherein the capillary passage forming surface is formed by a member surrounding an object support of the table, which member is thermally decoupled from a part of the table and the object support is configured to support the object.

13. A table for an immersion lithographic apparatus, the table comprising:
a capillary passage forming surface configured to form a first side of a capillary passage when an object is on the table, a surface of the object forming a second side, opposite to the first side, of the capillary passage; and
a channel configured such that an overpressure of gas in the channel is effective to apply a radially outward force on a liquid in the capillary passage, when the liquid is in the capillary passage, with a net flow of the gas radially inwardly of the liquid in the capillary passage.

14. The table of claim 13, further comprising, radially inwardly of the channel, an inner projection which surrounds an object support of the table, the object support configured to support the object.

15. The table of claim 14, wherein, when an object is on the table, the object is between 2 and 20 μm from the inner projection.

16. The table of claim 14, configured to flow a gas out of the channel and between the inner projection and the object.

17. The table of claim 13, further comprising a meniscus pinning feature positioned between the capillary passage forming surface and the channel, the meniscus pinning feature configured to pin a radially inward position of a meniscus of the liquid in the capillary passage.

18. The table of claim 13, wherein the capillary passage forming surface is formed by a member surrounding an object support of the table, which member is thermally decoupled from a part of the table and the object support is configured to support the object.

19. A table for an immersion lithographic apparatus, the table comprising:

a capillary passage forming surface configured to form a first side of a capillary passage when an object is in a recess in a top surface of the table, a surface of the object forming a second side, opposite the first side, of the capillary passage; and an opening in a surface of the table, the opening in or adjacent to the capillary passage forming surface and configured to supply liquid to the capillary passage, the opening being intermediate the ends of the capillary passage.

20. The table of claim 19, configured to connect the opening to an under pressure source to remove liquid from the capillary passage.

* * * * *